United States Patent
Sawada et al.

(10) Patent No.: US 7,780,826 B2
(45) Date of Patent: Aug. 24, 2010

(54) CR-DOPED FECOB BASED TARGET MATERIAL AND METHOD FOR PRODUCING THE SAME

(75) Inventors: Toshiyuki Sawada, Himeji (JP); Akihiko Yanagitani, Himeji (JP)

(73) Assignee: Sanyo Special Steel Co., Ltd., Hyogo-Ken (JP)

( * ) Notice: Subject to any disclaimer, the term of this patent is extended or adjusted under 35 U.S.C. 154(b) by 343 days.

(21) Appl. No.: 11/893,111

(22) Filed: Aug. 14, 2007

(65) Prior Publication Data
US 2008/0063555 A1 Mar. 13, 2008

(30) Foreign Application Priority Data
Aug. 16, 2006 (JP) ............................. 2006-222059

(51) Int. Cl.
*C25B 11/04* (2006.01)
(52) U.S. Cl. .................................. 204/298.13; 419/66
(58) Field of Classification Search .................. None
See application file for complete search history.

(56) References Cited

U.S. PATENT DOCUMENTS

| | | | |
|---|---|---|---|
| 5,780,175 A | 7/1998 | Chen et al. | |
| 6,632,520 B1 | 10/2003 | Hiramoto et al. | |
| 6,828,046 B2 | 12/2004 | Ikeda et al. | |
| 7,294,418 B2 | 11/2007 | Ikeda et al. | |
| 2002/0058159 A1 | 5/2002 | Kubota et al. | |
| 2006/0042938 A1 | 3/2006 | Cheng et al. | |
| 2006/0199044 A1* | 9/2006 | Thangaraj et al. | 428/829 |
| 2007/0017803 A1* | 1/2007 | Ziani et al. | 204/298.13 |
| 2007/0251821 A1* | 11/2007 | Yanagitani et al. | 204/298.13 |
| 2008/0112841 A1* | 5/2008 | Hayashi et al. | 420/79 |

FOREIGN PATENT DOCUMENTS

| | | |
|---|---|---|
| JP | 62040363 A | 2/1987 |
| JP | 6035654 B2 | 5/1994 |
| JP | 2004-346423 | 12/2004 |
| JP | 2005-320627 | 11/2005 |

OTHER PUBLICATIONS

Max Hansen, PhD, et al., "Constitution of Binary Alloys", 2nd ed., 1958, pp. 471-474, McGraw-Hill Book Company, Inc., USA.

* cited by examiner

*Primary Examiner*—John P Sheehan
(74) *Attorney, Agent, or Firm*—The Webb Law Firm

(57) ABSTRACT

There is disclosed a method for producing a Cr-doped FeCoB based target material that can be used efficiently in magnetron sputtering processes and has a low magnetic permeability. In the method for producing the target material, there are firstly provided raw-materials of two or more kinds of FeCoB based alloy powders which are different in composition from each other, wherein at least one of the FeCoB based alloy powders comprises Fe and Co in a total amount of 60 atom % or more such that Fe:Co atomic ratio is within a range of 70:30 to 40:60, and comprises Cr in an amount which is from 15 to 25 atom % greater than B. Then, the two or more kinds of the FeCoB based alloy powder are mixed and consolidated to form a target material.

2 Claims, No Drawings

CR-DOPED FECOB BASED TARGET MATERIAL AND METHOD FOR PRODUCING THE SAME

CROSS-REFERENCES TO RELATED APPLICATION

This application claims priority to Japanese Patent Application No. 222059/2006 filed on Aug. 16, 2006, the entire disclosure of which is incorporated herein by reference.

BACKGROUND OF THE INVENTION

1. Field of the Invention

This invention relates to a Cr-doped FeCoB based target material used for forming a soft magnetic thin-film, and a method for producing the target material.

2. Description of Related Art

The recent progress in the magnetic recording technology is remarkable, and the record densities of magnetic record media are being heightened for increasing capacities of drives. In the magnetic record media for the longitudinal magnetic recording systems currently used worldwide, however, an attempt to realize a high record density leads to refined record bits, which require a high coercivity to such an extent that recording cannot be made with the record bits. In view of this, a perpendicular magnetic recording system is under study as a means of solving these problems and improving the record densities.

The perpendicular magnetic recording system is a system in which a magnetization-easy axis is oriented in the direction vertical to a medium surface in the magnetic film of the perpendicular magnetic record medium, and is suitable for high record densities. In addition, as for the perpendicular magnetic recording system, a two-layered record medium has been developed having a magnetic record film layer where the record sensitivity is improved and a soft magnetic film layer. A CoCrPt—$SiO_2$ based alloy is generally used in the magnetic record film layer.

On the other hand, examples of known soft magnetic layers are as follows. Japanese Patent Laid-Open Publication No. 346423/2004 discloses a Fe—Co—B based alloy target material in which the diameter of the maximum inscribed circle which can be drawn in a region with no boride phase in a cross-microstructure is equal to 30 μm or less. Japanese Patent Laid-Open Publication No. 320627/2005 discloses a method for producing a Co alloy target material comprising 1 to 10 atom % Zr and 1 to 10 atom % Nb and/or Ta, and the balance being essentially Co, suggesting that quenching treatment is performed on a molten Co alloy to produce alloy powder, and then the alloy powder having a particle size of 500 μm or less is pressed and sintered to obtain a Co alloy target material.

Magnetron sputtering method is generally used for the preparation of the aforementioned soft magnetic film. This magnetron sputtering method is a method in which a magnet is disposed behind a target material to leak the magnetic flux onto a surface of the target material for converging plasma in the leaked magnetic flux region, enabling a high-speed coating. Since the magnetron sputtering method has a feature of leaking the magnetic flux on the sputtering surface of the target material, in the case where magnetic permeability of the target material itself is high, it is difficult to form, on the sputtering surface of the target material, the leaked magnetic flux necessary and sufficient for the magnetron sputtering method. In view of this, Japanese Patent Laid-Open Publication No. 346423/2004 is proposed for a demand for reducing the magnetic permeability of the target material itself as much as possible.

However, the maximum thickness of the target product produced as described above is approximately 5 mm. If the thickness exceeds 5 mm, leaked magnetic flux is insufficiently created on the surface of the target material, resulting in the impossibility of normal magnetron sputtering. A Fe-based material is desired since a high magnetic flux density is required for a film of a target material used for the magnetron sputtering. In this case, however, corrosion resistance is unsatisfied, while there are problems that the oxidation of the target material degrades the film quality and that an abnormal discharge occurs in an oxidized area during the sputtering process to result in sputtering failure.

SUMMARY OF THE INVENTION

The inventors have now found that a highly efficient magnetron sputtering can be possible by using, as part of the raw materials for an FeCoB based target material doped with Cr for improving the atmospheric resistance, at least an alloy powder which comprises Fe and Co in a total amount of 60 atom % or more such that Fe:Co atomic ratio ranges from 70:30 to 40:60, and comprises Cr in an amount which is from 15 to 25 atom % greater than an amount of B.

Accordingly, it is an object of the present invention to provide and produce a Cr-doped FeCoB based target material that can be used efficiently in magnetron sputtering processes and has a low magnetic permeability.

Specifically, according to the present invention, there is provided a method for producing a Cr-doped FeCoB based target material, comprising the steps of:

providing raw-materials of two or more kinds of FeCoB based alloy powders which are different in composition from each other, wherein at least one of the FeCoB based alloy powders comprises Fe and Co in a total amount of 60 atom % or more such that Fe:Co atomic ratio is within a range of 70:30 to 40:60, and comprises Cr in an amount which is from 15 to 25 atom % greater than B;

mixing the two or more kinds of the FeCoB based alloy powder together to obtain a powder mixture; and consolidating the powder mixture to form a target material.

Further, according to the present invention, there is provided a Cr-doped FeCoB based target material having a maximum magnetic permeability of 25 or less.

DETAILED DESCRIPTION OF THE INVENTION

Method for Producing Cr Doped FeCoB Based Target Material

Typically, a FeCoB based target material can be obtained, as described in Japanese Patent Laid-Open Publication 346423/2004, by producing an alloy powder through a method such as gas atomizing, sintering thus obtained raw-material powder through a method such as hot isostatic pressing, and then being subjected to machining to provide a shape as a target material. The most important feature of the present invention is that, for the Cr-doped FeCoB based target material, instead of single alloy powder, two or more kinds of powder are used as the raw-material powder, and alloy powder used as at least one of them has a low saturation magnetic flux density, in which Fe, Co and Cr, B fall within ranges as described below, thereby achieving a reduced magnetic permeability even in a target material of the same composition.

More specifically, in the producing method according to the present invention, two or more kinds of the FeCoB based alloy powders which are different in composition are provided in which at least one kind or two or more kinds of the FeCoB based alloy powder comprises Fe and Co in a total amount of 60 atom % or more such that atomic ratio of Fe:Co is within a range of 70:30 to 40:60, and also comprises Cr in an amount which is from 15 to 25 atom % greater than B.

The reasons that the component composition is limited as described above will be described below.

The inventors have studied magnetic characteristics and constituent phases in the three elements, Fe—Co—Cr. As a result, the inventors have found out that the saturation magnetic flux density significantly reduces within the compositional range in which the atomic ratio of Fe:Co is within a range of 70:30 to 40:60 and Cr is not less than 15 atom %. In other words, it was found that the main constituent phases in this composition region were fcc phase and hcp phase, both of which were found to have low saturation magnetic flux densities.

In the three elements, when Fe is richer than the Fe:Co ratio of 70:30, bcc phases in which the saturation magnetic flux density is high are increased, whereas when Co is richer than the Fe:Co ratio of 40:60, the saturation magnetic flux density increases especially in fcc phase, between fcc phase and hcp phase, leading to an increase in saturation magnetic flux density. It was also found that, even in the range of the Fe:Co of 70:30 to 40:60, Cr content of less than 15 atom % leads to an increase in saturation magnetic flux density. It was further found that Cr content of more than 25 atom % increases brittle phases.

Next, as a result of studying the magnetic characteristics of the four elements of the Fe—Co—Cr—B, it was found that, for Fe:Co ratio, the same behavior was observed as the Fe—Co—Cr ternary system while, for Cr and B, mainly Cr boride is formed in the four elements. Although the Cr boride itself does not significantly affect the magnetic characteristics, Cr is consumed as the compound. As a result, the concentration of Cr in the FeCo based matrix decreases, thus increasing the saturation magnetic flux density of the matrix. Accordingly, it was found that an alloy can be designed on the assumption that the Cr content in the above ternary system is equal to the content after subtracting the B content from the Cr content (hereinafter referred to as "Cr—B content"). That is, the Cr—B content of less than 15 atom % leads to an increase in the saturation magnetic flux density, while the Cr—B content of more than 25 atom % leads to an increase in brittle phases.

When the total amount of Fe and Co is less than 60 atom % in alloy powder with a low saturation magnetic flux density, the amounts of Fe and Co in the other element powders increase, resulting in a powder having a high saturation density. As a result, the magnetic permeability of the entire target increases, leading to impossibility of efficient magnetron sputtering. According to a preferred aspect of the present invention, this alloy power having a low saturation magnetic flux density preferably comprises Fe and Co in a total amount of 60 to 80 atom %.

In this manner, two or more kinds of FeCoB based alloy powders are mixed to obtain a powder mixture, and then the powder mixture is consolidated to form a target material. The consolidating process can conducted through a well-known method as described in Japanese Patent Laid-Open Publication No. 346423/2004, but is not particularly limited. According to a preferred aspect of the present invention, a pressure of 50 MPa or higher, preferably 100 to 500 MPa, is preferably applied to the above powder mixture at a temperature of 800 to 1200° C., preferably 900 to 1100° C., so as to consolidate a target material. The consolidating process to be employed in the method of the present invention is not particularly limited and may be any process, for example, hot consolidation, such as HIP and hot pressing, as long as the resulting target material can be consolidated in high density. The powdering process is not particularly limited and may be any technique of gas atomizing, water atomizing or casting-pulverizing. Within the above consolidating temperature range, it is possible to ensure a high sintered density and also to appropriately control the development of the diffusion between particles to prevent the formation of a large amount of phases with a high magnetism. By adopting a consolidating pressure within the above range, it is possible to ensure a high sintered density and also to improve cost efficiency and production efficiency.

Cr-Doped FeCoB Based Target Material

According to the producing method of the present invention as described above, there is produced the Cr-doped FeCoB based target material that can be used efficiently in magnetron sputtering processes and has a low magnetic permeability. According to a preferred aspect of the present invention, the Cr-doped FeCoB based target material has a maximum magnetic permeability of 25 or less.

According to a preferred aspect of the present invention, the target material preferably has a Cr content of 0.5 to 18 atom %, more preferably 5 to 15 atom %, and preferably has a B content of 5 to 30 atom %, more preferably 10 to 15 atom %.

According to a more preferred aspect of the present invention, the Cr-doped FeCoB based target material comprises:

Co: 15 to 40 atom %, preferably 25 to 35 atom %;

Cr: 0.5 to 18 atom %, preferably 5 to 15 atom %;

B: 5 to 30 atom %, preferably 10 to 15 atom %; and the balance Fe and unavoidable impurities.

EXAMPLES

The present invention will be described below in detail with reference to examples.

As shown in Table 1 and Table 2, raw-material powers were produced by a gas atomizing technique. The gas atomizing was conducted on condition that the type of the gas was an argon gas, the diameter of a nozzle was 6 mm and the gas pressure was 5 MPa. Then, the powder thus produced was classified by use of a 500 µm sieve. Then, the obtained powder was agitated for one hour by a V-type mixer. The powder thus produced was charged into a sealed container made of SC material and having a diameter of 200 mm and a length of 100 mm. Then, the sealed container was exhausted and vacuum-sealed at an ultimate pressure of $10^{-3}$ torr or less. Then, HIP (Hot Isostatic Pressing) was performed to produce a compact on the condition that the heating temperature is 1000° C., the pressure is 150 MPa and the retention time is five hours. Then, the compact thus produced was subjected to a machining process and a wire cutting process to obtain target materials each having a final shape with an outer diameter of 180 mm and a thickness of 7 mm. The characteristics of the target materials are shown in Table 2.

TABLE 1

| | Raw-Material Powder (1) Composition (at %) | | | | | | Bs | |
|---|---|---|---|---|---|---|---|---|
| No. | Fe | Co | Cr | B | Fe:Co | Cr—B | KGauss | Remarks |
| 1 | 48 | 32 | 20 | 0 | 60:40 | 20 | 4 | Examples |
| 2 | 56 | 24 | 20 | 0 | 70:30 | 20 | 6 | |
| 3 | 28 | 37 | 25 | 10 | 43:57 | 15 | 8 | |
| 4 | 33 | 32 | 30 | 5 | 51:49 | 25 | 2 | |
| 5 | 35 | 35 | 25 | 5 | 50:50 | 20 | 2 | |
| 6 | 60 | 20 | 20 | 0 | <u>75:25</u> | 20 | 14 | Comparative |
| 7 | 25 | 40 | 25 | 10 | <u>38:62</u> | 15 | 11 | Examples |
| 8 | 42 | 28 | 20 | 10 | 60:40 | <u>10</u> | 15 | |
| 9 | 42 | 28 | 30 | 0 | 60:40 | <u>30</u> | 3 | |

(Underlined part is outside the conditions of the present invention)

TABLE 2

| | Target Material Composition (at %) | | | | | Raw-Material Powder (1) No. | Raw-Material Powder (2) Composition | | | Mixing Ratio/Mass Ratio | | Max. Magnetic Permeability | |
|---|---|---|---|---|---|---|---|---|---|---|---|---|---|
| No | Fe | Co | Cr | B | Fe:Co | | Fe | Co | B | Powder (1) | Powder (2) | (μm) | Remarks |
| 1 | 52 | 28 | 10 | 10 | 65:35 | 1 | 56 | 24 | 20 | 54.1 | 45.9 | 25 | Examples |
| 2 | 52 | 28 | 10 | 10 | 65:35 | 2 | 48 | 32 | 20 | 53.9 | 46.1 | 25 | |
| 3 | 52 | 28 | 10 | 10 | 65:35 | 3 | 68 | 22 | 10 | 39.8 | 60.2 | 25 | |
| 4 | 52 | 28 | 10 | 10 | 65:35 | 4 | 61.5 | 26 | 12.5 | 34.4 | 65.6 | 20 | |
| 5 | 52 | 28 | 10 | 10 | 65:35 | 5 | 61.2 | 24.2 | 12.7 (1.9Cr) | 36.3 | 63.7 | 20 | |
| 6 | 52 | 28 | 10 | 10 | 65:35 | 6 | 44 | 36 | 20 | 53.7 | 46.3 | 45 | Comparative |
| 7 | 52 | 28 | 10 | 10 | 65:35 | 7 | 70 | 20 | 10 | 39.8 | 60.2 | 40 | Examples |
| 8 | 52 | 28 | 10 | 10 | 65:35 | 8 | 62 | 28 | 10 | 49.6 | 50.4 | 45 | |
| 9 | 52 | 28 | 10 | 10 | 65:35 | 9 | 57 | 28 | 15 | 35.7 | 64.3 | Processing difficulty | |
| 10 | 52 | 28 | 10 | 10 | 65:35 | Consolidating using single raw-material powder | | | | | | 50 | |

For evaluation items of the characteristics of the target materials thus produced, the powder saturation magnetic flux density (Bs) and the magnetic permeability were measured as described below.

(1) Powder Saturation Magnetic Flux Density (Bs)

The saturation magnetic flux density (Bs) of the powder was measured by the use of a vibrating sample magnetometer (VSM) in an applied magnetic field of 1200 kA/m.

(2) Magnetic Permeability Measurements

Ring specimens each having an outer diameter of 15 mm, an inner diameter of 10 mm, and a height of 5 mm were made. Then, a B-H tracer was used to measure the magnetic permeability of each ring specimen in an applied magnetic field of 8 kA/m. The measurement item is the maximum magnetic permeability.

Table 1 shows the raw-material powder (1) and the saturation magnetic flux density (Bs). Nos. 1 to 5 are the examples of the present invention, while Nos. 6 to 9 are the comparative examples. Comparative examples Nos. 6 and 7 have Fe:Co atomic ratios, which fall outside the Fe:Co range of 70:30 to 40:60 according to the present invention. Comparative examples Nos. 8 and 9 illustrate alloy powders in the cases where the Cr—B contents fall outside the range of 15 to 25 atom %. However, all of examples Nos. 1 to 5 have Fe:Co atomic ratios and the Cr—B content within the range of 15 to 25 atom % according to the present invention.

Table 2 shows the target material composition, the compositions and the mixing ratio of the raw-material powder (1) and the raw-material powder (2), and the magnetic permeability of the target material. As shown in Table 2, Nos. 1 to 5 are the examples of the present invention, while Nos. 6 to 10 are the comparative examples. In each of the comparative examples Nos. 6 to 9, since the raw-material powder (1) falls outside the condition range of the present invention as shown in Table 1, the maximum magnetic permeability is high. In No. 9, the processing was difficult. In No. 10, it can be seen that, since the target material was consolidated by use of the single raw-material powder as in the conventional cases, the maximum magnetic permeability was high.

In contrast, it can be seen that, since each of example Nos. 1 to 5 of the present invention satisfies the conditions of the present invention, the maximum magnetic permeability is low. In view of these, the following facts can be seen. Since the compositions of the target materials in Nos. 1 to 10 are similar, the characteristics of the films after the sputtering process are similar to each other. However, in the stage of the target material before being formed into a film, the examples of the present invention differ in the maximum magnetic permeability from the comparative examples, and thus differ in the density of magnetic flux leaking from the target surface in the sputtering process. It is seen from these points that the examples of the present invention provide advantages for sputtering over the comparative examples.

As described above, in the FeCoCr ternary system, the saturation magnetic flux density is significantly low in the composition comprising Fe and Co in an Fe:Co element ratio of 70:30 to 40:60 and Cr of 15 to 25 atom %. Further, in the FeCoCrB quaternary system, for Fe:Co ratio, the same behavior was observed as the FeCoCr ternary system. In the quaternary system, B mainly form a Cr based boride. The Cr based boride does not significantly affect the magnetic characteristics, but the Cr concentration in the FeCo based matrix decreases. As a result, the Cr content in the ternary system is assumed to be equal to the Cr—B content. Accordingly, by the use of a raw-material powder having a composition of the Cr—B content of 15 to 25 atom %, significantly beneficial effects of reducing the magnetic permeability of the target material are successfully attained.

What is claimed is:

1. A Cr-doped FeCoB based target material which is produced by a method comprising the steps of:

providing raw-materials of two or more kinds of FeCoB based alloy powders which are different in composition from each other, wherein at least one of the FeCoB based alloy powders comprises Fe and Co in a total amount of 60 atom % or more such that Fe:Co atomic ratio is within a range of 70:30 to 40:60, and comprises Cr in an amount which is from 15 to 25 atom % greater than B;

mixing the two or more kinds of the FeCoB based alloy powder together to obtain a powder mixture; and consolidating the powder mixture to form a target material, wherein the Cr-doped FeCoB based target material has a maximum magnetic permeability of 25 of less.

2. The Cr-doped FeCoB based target material according to claim 1, comprising 5 to 30 atom % B, and 0.5 to 18 atom % Cr.

* * * * *